United States Patent [19]

Schink

[11] 3,751,306

[45] Aug. 7, 1973

[54] SEMICONDUCTOR ELEMENT

[75] Inventor: Norbert Schink, Erlangen, Germany

[73] Assignee: Siemens Aktiengesellschaft, Berlin and Munich, Germany

[22] Filed: Dec. 3, 1969

[21] Appl. No.: 881,751

[30] Foreign Application Priority Data

Dec. 24, 1968 Germany .................. P 18 16 841.7
Dec. 4, 1968 Germany .................. P 18 12 556.9

[52] U.S. Cl. ................ 148/33.3, 117/200, 117/218, 148/1.5, 317/235 R

[51] Int. Cl. ............................................. H01l 3/12

[58] Field of Search ...................... 148/33.3, 33, 1.5; 117/200, 218

[56] References Cited

UNITED STATES PATENTS

| | | | |
|---|---|---|---|
| 3,160,520 | 12/1964 | Jantsch et al. | 117/201 X |
| 3,447,237 | 6/1969 | Tokuyama et al. | 29/590 |
| 3,460,003 | 8/1969 | Hampikian et al. | 317/234 |
| 3,506,502 | 4/1970 | Nakamura | 148/174 |
| 3,316,465 | 4/1967 | Von Bernuth et al. | 148/33.3 |
| 3,447,975 | 6/1969 | Bilo et al. | 148/33.3 |

*Primary Examiner*—L. Dewayne Rutledge
*Assistant Examiner*—J. M. Davis
*Attorney*—Curt M. Avery, Arthur E. Wilfond, Herbert L. Lerner and Daniel J. Tick

[57] ABSTRACT

A semiconductor element with a semiconductor body with pn-junction at the surface. At least the pn-junction is provided with an insulating layer. The insulating coating contains bivalent lead ions, and an additive whereby an oxide coat at the surface of the semiconductor body becomes permeable to bivalent lead ions. The additive contains fluorine ions or phosphate ions.

44 Claims, 4 Drawing Figures

SEMICONDUCTOR ELEMENT

The present invention relates to a semiconductor element, with a semiconductor body which has a pn-junction which comes to the surface, and which is provided at least on its surface at the pn-junction with a coating of insulating material.

Semiconductor bodies of known semiconductor structural elements, such as: diodes, transistors, thyristors and bilateral thyristors consist mostly of silicon, germanium or an intermetallic compound of the elements of the III and V group, or the II and VI group of the periodic system of the elements. The above semiconductor materials, within very short time become unavoidably covered, by the atmosphere, with a thin coat of the oxide of the semiconductor material. This oxide coating is quickly able to absorb water from the surrounding atmosphere. For silicon substances, silicic acids are thereby formed, which upon polarization again split off water.

The absorption and formation of water in the oxide coating is indirectly the reason for deterioration phenomena. It especially becomes evident that the blockage capability of pn-junction, which appear at the surface of the semiconductor substance of the structural elements subside in the course of operation. As a result, unstable characteristics of the elements occur.

The reason for the unstability is that water present in the oxide coat at the surface of the semiconductor substance dissociates, and atomic hydrogen is formed from the hydrogen ions at the negative charged surface portions of the semiconductor. At a pn-junction rendered polar in the high resistance direction, in the p-conductive zone, directly at the pn-junction a range of negative space charge is notoriously formed. At the surface of this region, the hydrogen ions are discharged, and during the working conditions of the structural elements, a metalloid with good electric conductivity causing accumulation of atomic hydrogen is gradually formed between the surface of the semiconductor substance and the oxide coat present on the semiconducor material. This extensively short circuits the region of negative space charge thus decreasing the blocking capacity of the pn-junction.

The object of this invention is to avoid the above-mentioned aging phenomena of the semiconductor structural elements. I solve this problem by coating at least at the surface where pn-junction is situated with a layer containing bivalent lead ions and an admixture, under whose influence, an oxide coating, on the surface of the semiconductor substance, becomes permeable for bivalent lead ions.

It is within the invention, that the insulating material contains an additive with fluorine ions. Under the influence of the fluorine ions present in the insulating coat of the semiconductor structural element, the oxide coat on the semiconductor substance becomes permeable to bivalent lead ions, which are also present in the insulating material coat. The bivalent lead ions, in the region of accumulation of atomic hydrogen between the surface of the semiconductor material and the oxide coat present on this surface, operate like a catalyst and promote the conversion of atomic into molecular hydrogen. Molecular hydrogen has no electric conductivity and no influence on the blockage capacity of pn-junctions and with that on the characteristics of the elements.

The invention also realizes that other additives besides fluorine ions, in the insulating material improve the permeability of the oxide coat on the semiconductor body to the bivalent lead ions, and thus in a similar manner and to a similar extent as the fluorine ions, contribute to the stabilization of the characteristic line of a semiconductor structural element.

The additive, which does not consist of fluorine ions, and improves the permeability of the oxide coat on the surface of the semiconductor substance for the bivalent lead ions, can be a polyhydroxy compound with at least two adjacent hydroxyl groups. Phosphate ions are also suitable as additives.

It is advantageous, if at a pn-junction, especially that part of the surface of the semiconductor body which contains the p-conducting zone is provided with a coating of the insulating material. The basic substance of the insulating material can be a silicon resin, preferably a mixed condensate of a phenylmethylpolysiloxane and an alkyl resin component, which in hardened phase, does not rupture even at low temperatures. It is advantageous for a stable blocking capacity of pn-junction if this mixed condensate is zinc free. Also other parent substances for the insulating substance, e.g., rubber or silicon-rubber are suitable.

The polyhydroxy compound, with at least two adjacent hydroxyl groups may be alizarin, an alizarin derivative or a chemical compound of these substances. Other suitable polyhydroxy compounds are mannitol, sorbitol, quercitol, derivatives of the same or a chemical compound of these substances, or their derivatives.

Ammonium-phosphate or tricresylphosphate are illustration of suitable chemical compounds containing and donating phosphate ions in the insulating material coat.

The bivalent lead ion content in the insulating coat is advantageously 0.001 to 30 percent by weight. The content on polyhydroxy compound in the insulating coat advantageously ranges from 0.05 to 30 percent by weight. If the polyhydroxy compound with at least two adjacent hydroxyl groups in the insulating coat consists of alizarin or an alizarin derivative, then the most favorable effect is, if the content of alizarin or alizarin derivative is 0.1 to 30 percent by weight. Furthermore the coating of insulating material may have besides a polyhydroxy compound with at least two adjacent hydroxyl groups, a fluorine ion content ranging from 0.0001 to 3 percent by weight. The phosphate ion content in the insulating material may be between 0.01 to 10 percent by weight.

The insulating matter coating may contain as donor of bivalent lead ions red lead (minium) ($Pb_2[PbO_4]$) lead carbonate ($PbCO_3$) and/or yellow lead oxide ($PbO$). Also a lead salt of a carboxylic acid is suitable as lead ion splitting off constituent, inasmuch as bivalent lead ions are bound in the same. Suitable are lead stearate, lead acetate, and lead naphthenate.

The share of red lead, lead carbonate and yellow lead oxide in the insulating substance is advantageously between 0.1 and 30 percent by weight, whereas share of stearate, lead acetate and lead naphthenate in the insulating matter is between 0.002 and 5 percent weight. Within these regions, the brushability of the insulating substances, such as lacquer or rubber is not impaired in the plastic condition.

The range for the portion of one of the materials collected in a group may mean, here and below, that in the insulating substance, one additive only or several additives of the group are contained, whose share(s) is in the stated range. Furthermore, the presence of an additive from one group does not exclude the presence of additives of another group.

The fluorine ions splitting off material, in the insulating coating may contain; besides of the non fluorine containing additive, for instance a polyhydroxy compound with at least two adjacent hydroxyl groups or phosphate ions; ammonium fluoride and/or a fluoride of an organic amine. The portion of ammonium fluoride and fluorides of an organic amine is favorably between 0.0002 and 0.2 percent by weight. Ammonium fluoride and fluorides of organic amines contain no constituents which have an ill effect on the characteristics of semiconductor structural elements.

It is especially advantageous, if the coating of insulating material contains, besides the non fluorine ion additive, lead fluoride ($PbF_2$), since lead fluoride contains both bivalent lead ions and fluorine ions. The insulating substance can favorably contain 0.001 to 30 percent by weight of lead fluoride.

It is also favorable, if lead alizarinate or lead quercetinate is contained in the insulating coating, as these substances yield bivalent lead ions, while also improving the permeability of an oxide membrane on the surface of a semiconductor body, to bivalent lead ions. The content of lead alizarinate in the insulating material is favorably between 0.0002 and 2 percent by weight.

In a further development of the invention the insulating coating on the semiconductor body may also contain bivalent lead ions of a polyhydroxy compound with at least two adjacent hydroxyl groups, or phosphate ions and in such a case fluorine ions, and ions of an alkaline metal, alkaline earth or earth metal, especially sodium, magnesium, calcium, strontium, and barium ions, as well as aluminum or gallium ions. By "earth" metal is meant group III of the periodic system, e.g., aluminum and gallium. Thus, an increase of the blocking voltage at the pn-junction is attained. Furthermore, it seems that alkaline, alkaline earth, and earth metal ions decrease from the outset, the concentration of the hydrogen ions and thereby ultimately the concentration of atomic hydrogen, in the oxide coat. If the insulating substance contains alkaline, alkaline earth, or earth metal salts of weak acids, e.g., carboxylic acids, then after finishing, the semiconductor structural elements are buffered by these salts. As a result acids, which infiltrate from ambient into the insulating coating and the oxide coat, that is the hydrogen ion concentration dissociated from the infiltrating acids is, especially in the oxide coat, considerably decreased.

It is of advantage the amount of alkaline, alkaline earth and earth metal ions in the insulating substance is between 0.1 and 20 percent by weight. Especially suitable as ion donors are salts of an alkaline, alkaline earth or earth metal, or of a carboxylic acid. Thus preferred are sodium stearate, magnesium stearate, calcium stearate and/or aluminum stearate, as they increase the blocking voltage at the surface of semiconductor substances at pn-junctions, but have a relatively slight effect on the inverse current of these pn-junctions. The total amount of sodium stearate, magnesium stearate, calcium stearate, and aluminum stearate in the insulating material is between 0.1 and 6 percent by weight. It became evident that in the insulating substance containing alkaline, alkaline earth or earth metal salts of a strong acid show less blocking voltage at the pn-junction in the semiconductor devices, than salts of a weak acid. On the other hand, salts of a strong acid contained in the insulating coating show a lower inverse current level of the pn-junction than salts of a weak acid. The inverse current level of the pn-junctions in this direction is also decreased by weak acids contained in the insulating material, e.g., stearic acid. It is advantageous if the insulating material covering contains 0.1 to 3 percent by weight of stearic acid. The inverse current level is also lowered by alizarin contained in the insulating material covering, as alizarin is also slightly acid.

It is favorable if the insulating material contains a fluoride of an alkali metal, alkaline earth metal and/or a fluoride of an earth metal in an amount between 0.002 and 15 percent by weight. These substances split off not only fluorine ions but also alkaline earth metal and earth metal ions.

The problem upon which the invention is based can also be solved by treating the surface of the semiconductor body with a medium which dissolves an oxide membrane existing at the surface, and subsequently or simultaneously rinsing with a rinsing fluid which contains bivalent lead ions. Advantageously a rinsing fluid is used which contains 0.001 to 100 mg bivalent lead ions per liter of liquid.

The invention shall be explained in particular with respect to the drawing in which.

Figure 1:
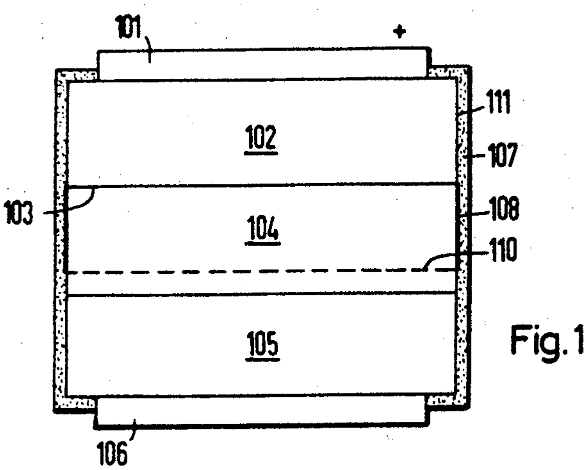
FIG. 1 shows a greatly enlarged section through the semiconductor bosy of a psn-diode without an insulating coating.

In FIG. 1 is a greatly enlarged and standardized semiconductor silicon body of a psn-diode. The following specifications, however, apply also for the semiconductor materials of other semiconductor structural elements, e.g., transistors, thyristors, or bilateral thyristors, as well as for semiconductor bodies of other semiconductor materials. the psn-diode described in the diagram shows a strong n-doped zone 102, a pn-junction 103, a low doped p-zone 104, and a strong p-doped zone 105. In the n-conducting zone 102, is a contact electrode 101 prepared of a gold-silicon eutectic mixture by alloying in an antimony containing gold foil. The strongly conducting p-zone 105 is installed by alloying in contact electrode 106 consisting of an aluminum-silicon eutectic mixture. The pn-junction 103 appears at surface 111 of the semiconductor body. At the surface, the surrounding atmosphere in a very short time forms an unavoidable oxide membrane 107, in this case of silicic acid-containing silicon dioxide.

The water present in the oxide coat 107 partially dissociates, atomic hydrogen is formed from the hydrogen ions, at the negative charged surface part of the semiconductor body. At the high resistance directed polarized diode, that means where the contact electrode 101 and the n-conducting zone 102 are positively biased, and the contact electrode 106 and the p-conducting zones 104 and 105 are negatively biased, there is a negative charged surface portion, at that part of the semiconductor body, where the weak conducting p-zone 104 lies, and where, as is known, exists a negative space charge region defined by the dotted line 110. At the surface of the negative space charge region, hydrogen ions discharged during operating conditions, gradually form an electric well conductive, metalloid active accumulation 108 of atomic hydrogen, between the surface of the semiconductor body and the oxide coat 107. This largely short circuits the negative space charge region, and decreases thereby the blocking capacity of the pn-junction 103.

According to the invention the oxide coat of the semiconductor body at its surface is dissolved by a medium which contains bivalent lead ions, and is so removed. Bivalent lead ions, which in itself cannot penetrate an oxide coat at the surface of the semiconductor body, reach the surface cleared from the oxide coat. After removal of the oxide coat, a new oxide coat is soon reformed, but now bivalent lead ions are between that coat and the surface of the semiconductor body. These operate like a catalyst on the atomic hydrogen formed by discharge of hydrogen ions, and promote its conversion to molecular hydrogen. Molecular hydrogen has no electric conductivity and has no influence on the blocking capacity of the pn-junction 103, and thus on the characteristics of the structural element. The characteristics therefore remain stable also during the operation of the structural element.

Bivalent lead ions come also directly to the surface of the semiconductor body, if the body was treated with a medium which dissolves the oxide coat, and subsequently immediately rinsed with a rinsing liquid which contains bivalent lead ions. This rinsing liquid may contain for example 0.001 to 1,000 mg bivalent lead ions per liter of liquid. Preferred is a rinsing fluid which contains 0.1 to 10 mg bivalent lead ions per liter of liquid.

It is advantageous to choose a rinsing liquid, which cannot dissolve an oxide coat at the surface of the semiconductor body. A rinsing liquid, which oxidizes at the surface of the semiconductor body, is favorable. Examples of suitable rinsing liquids are chemically pure water and chemically pure alsohol, e.g., methanol or ethanol to which had been added a substance which cleaves off bivalent lead ions. In both liquids an oxide coat, which contains bivalent lead ions, is formed at the surface of the semiconductor body and which inhibits decreases of the concentration directly between the surface of the semiconductor body and the oxide coat situated lead ions, during the operation of the element.

Compared with water, rinsing with alcohol has the advantage that the surface dries more quickly. The oxide membrane formed when rinsing with alcohol is thinner than that when rinsing with water. A mixture of water and alcohol which contains bivalent lead ions may also be used as the rinsing fluid. It may also be first rinsed with water and subsequently with alcohol The surface of the semiconductor body may also after-treated with a medium containing bivalent lead ions and which dissolves the oxide coat being at the surface, be rinsed with a rinsing liquid, especially water and/or alcohol, which contains bivalent lead ions.

Media suitable to dissolve an oxide coat on the surface of a semiconductor body are aqueous solutions of sodium or potassium hydroxide, hydrofluoric acid, or mixtures of hydrofluoric acid and fuming nitric acid, or of hydrofluoric acid and bromine. The aqueous sodium or potassium hydroxide solution may contain, e.g., 50 percent sodium or potassium hydroxide by weight. Also preferred is a mixture of hydrofluoric acid and fuming nitric acid in the proportion of weight 1:1.

For the dissolution of the oxide coat at the surface of the semiconductor body, gaseous media may also be used. For instance the vapors of aqueous hydrogen fluoride solution or alizarin vapors may be used. The vapor of the hydrogen fluoride solution may also contain bromine or chlorine, preferably in the molecular proportion of 1:1. It may be advantageous, to warm the semiconductor bodies to a temperature up to 250° C when treating their surface with a gaseous medium. A great number of semiconductor bodies can be simultaneously treated with a gaseous medium in a simple way. To the gaseous media may be admixed vapors of a chemical compound which split off bivalent lead ions, e.g. lead chloride. For instance, a flow of a gaseous medium for the dissolution of the oxide coat is first passed over a warmed container in which is a chemical compound containing bivalent lead ions, and subsequently over the semiconductor body.

The rinsing liquid may contain as a donor for bivalent lead ions a lead salt of a carboxylic. Favorable are lead acetate, if the rinsing fluid is water and lead stearate or lead naphthenate, if the rinsing liquid is alcohol. The rinsing fluid may also contain lead nitrate as an ion donor. Other bivalent lead containing salts are also suitable. The same salts may also be contained in the etching fluid, which dissolves the oxide coat on the surface of the semiconductor body. The etching fluid and the rinsing fluid which dissolve the oxide coat may also contain an additive of 0.002 to 2,000 mg lead salts of a carboxylic acid and/or lead nitrate per liter of liquid. 0.02 to 20 mg lead salt of a carboxylic acid, or lead nitrate per liter of liquid is preferred. These ranges of salts in a group signify, that in the respective etching fluid, one or more salts of this group may be present, which are within the specified range.

The surface of the semiconductor body can have the oxide coat dissolved off or can be rinsed by exposure to a liquid jet or immersion in a bath. It is sufficient, if the temperature of the etching and rinsing fluid, and thereby of the semiconductor body is in the range between the melting temperature of the respective liquid and 90° C, especially at room temperature (about 20° C). The temperature of the liquid may also be above this range. After treatment with liquid, the semiconductor body is dried by heating to about 150° C. After drying, the surface of the semiconductor body can be provided with an insulating material coat, which contains bivalent lead ions. Thereby it is assured that the surface of the semiconductor body does not get depleted on bivalent lead ions after some length of operation. The insulating material may consist for instance out of a lacquer or rubber, in which minium (red lead), lead carbonate, yellow lead oxide, and/or a lead salt of a carboxylic acid as donor of bivalent lead ions, is present.

Figure 2:
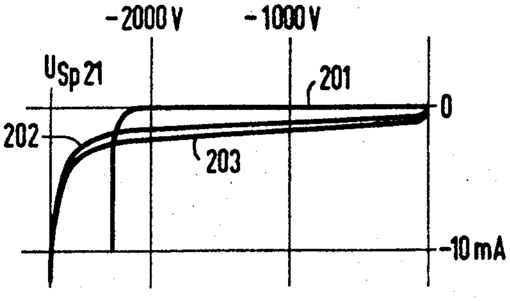
FIG. 2 shows blocking characteristic lines stabilized according to the invention.

FIG. 2 shows the characteristic lines of a psn-diode, with a semiconductor of silicon body similar to that seen in FIG. 1, surface of which after production of the pn-junction alloying in the electrodes with a mixture of hydrofluoric acid and fuming nitric acid in the proportion by weight of 1:1 treatment, was immediately treated for at least 30 seconds with water which contains 100 mg lead acetate per liter for rinsing. After drying, the semiconductor body was provided with a surface coating, which consists of a hardened cyclohexanone solution of the mixed condensate of the terephthalic acid glycerine ester and phenylmethylpolysiloxane without a further admixture. The cold characteristic line of this diode is 201, the warm characteristic line at 160° C immediately after reaching this temperature is 202, and the warm characteristic line at 160° C, after that the semiconductor body of the diode was held 48 hours at this temperature is 203. The electrodes during this time were biased in high resistance direction with a direct voltage of about 80 percent of the warm biasing potential. As can be seen in FIG. 2 the warm biasing potential $U_{Sp21}$ practically has not changed.

Figures 3, 4:
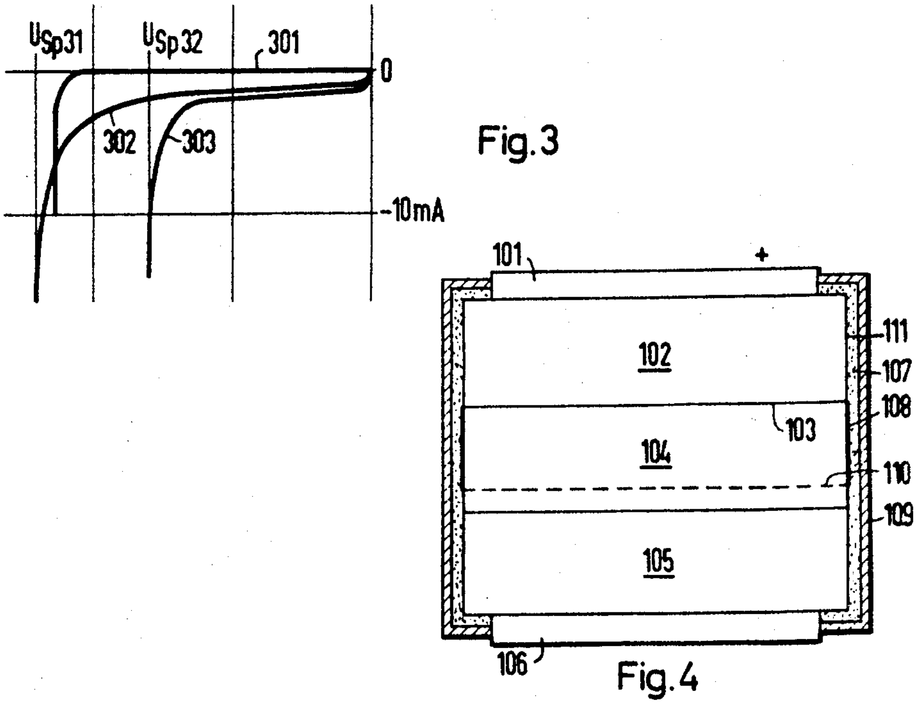
FIG. 3 shows blocking characteristic lines of a psn-diode, which are not stabilized according to the invention.
FIG. 4 shows a section through the semiconductor substance of a psn-diode with insulating material covering.

FIG. 3, in comparison with the above, shows blocking characteristics of a diode with an equal semiconductor body as that with the characteristics according to FIG. 2, whose semiconductor body, however, has not been treated according to the invention. As follows from FIG. 3, the cold characteristic line 30 has practically the same pattern as the cold characteristic line 201 in FIG. 2. But already the course of the warm characteristic line 302, which was plotted at 160° C immediately after reaching this temperature, no longer corresponds with the course of the warm characteristic line 202 in FIG. 2. Especially the warm biasing potential $U_{Sp31}$ is about 150 V less than the warm biasing voltage $U_{Sp21}$ in FIG. 2. As the warm characteristic line 303 shows, that after warming for 48 hours of the semiconductor body of the diode to a temperature of 160° C, at simultaneous application of direct current of about 80 percent, of the warm biasing potential $U_{Sp31}$, was absorbed at the electrode in the high resistance direction, the warm biasing potential $U_{Sp32}$ after that time had moved down about 25 percent, compared with the starting level of $U_{Sp31}$ at 160° C.

FIG. 4 shows another example of operation according to the invention. This consists also of a semiconductor body of a psn-diode of silicon. It shows a strong n-doped zone 102, a pn-junction 103, a weakly p-doped zone 104 and a strongly p-doped zone 105. At the n-conducting zone 102 is a contact-electrode 101 consisting of a gold-silicon eutectic mixture, containing antimony, whereas at the strong p-conducting zone 105 is placed a contact-electrode 106 consisting of an aluminum-silicon eutectic mixture. The pn-junction 103 appears at the surface 111 of the semiconductor body. At this generated surface, in the surrounding atmosphere within a short time, an unavoidable oxide coat 107. In this case silicic acid, containing silicon dioxide formed. This surface was first etched with an etching jet of a mixture of 40 percent hydrofluoric acid and fuming nitric acid (96 to 100 percent) in the proportion by volume of 1:2 or 3:2 and preferably 1:1. The semiconductor body and etching liquid were at room temperature (20 to 25° C). The etching time was from 4 to 12 seconds, preferably 8 seconds. Thereafter the surface was rinsed for 20 to 60 seconds with distilled or deionized water, and dried under an infrared lamp. The insulating material 109 in liquid or plastic phase, to which was previously added toluene, xylene, cyclohexanone and/or cyclohexanol, wherein are substances splitting off bivalent lead ions, and the additive under whose influence a substance containing and splitting off bivalent lead ion is dissolved, was applied at the surface of the semiconductor body. Toluene, xylene, cyclohexanone and cyclohexanol are good and easily volatile solvents. In the four solvents mentioned there may also be dissolved substances yielding fluorine ions, as well as alkaline metal, alkaline earth metal or earth metal donating ions. After application of the insulating substance 109, the semiconductor body can be warmed for hardening the coating. Advantageously this takes place in an oven, where the semiconductor body can be brought to temperatures of 180 to 300° C, as at these temperatures there is neither a destruction of the insulating material, nor changes in the electric properties of the semiconductor body. The insulating material on the semiconductor, may also be left in plastic phase, if the semiconductor is subsequently to be set in a corresponding suitable shell.

The thickness of the insulating material coat 109 in the plastic state is about 0.8 to 1.1 mm, and the hardened state 0.5 to 0.7 mm.

I claim:

1. In a semiconductor element having a semiconductor body with an oxide coating on the surface thereof; a pn-junction appearing at said surface of such semiconductor body; wherein a coating of organic insulating material containing bivalent lead is disposed on at least a portion of said surface proximate to where said pn-junction emerges on said body; and an additive in said organic insulating material for reacting with said oxide coat on the surface of the semiconductor body wherein such oxide coat is caused to become permeable to said bivalent lead ions.

2. The semiconductor element of claim 1, wherein the insulating material contains an additive of fluorine ions,

3. The semiconductor element of claim 1, wherein the additive in the insulating substance is a polyhydroxy compound with at least two adjacent hydroxyl groups.

4. The semiconductor element of claim 1, wherein the additive in the insulating material is phosphate ions.

5. The semiconductor element of claim 1, wherein the insulating material containing the additive consists of a lacquer or caoutchouc.

6. The semiconductor element of claim 1, wherein especially the surface of that part of the semiconductor body which contains the p-conducting zone is provided with a coating of insulating material.

7. The semiconductor element of claim 1, wherein the bivalent lead ion content in the insulating material is from 0.0001 to 30 percent by weight.

8. The semiconductor element of claim 1, wherein the insulating substance contains at least one of minium, lead carbonate, and yellow lead oxide.

9. The semiconductor element of claim 8, wherein the amount of minium, lead carbonate and yellow lead oxide in the insulating material is between 0.1 and 30 percent by weight.

10. The semiconductor element of claim 1, wherein the insulating substance contains the lead salt of a carboxylic acid.

11. The semiconductor element of claim 10, wherein the insulating substance contains at least one of lead stearate, lead acetate, and lead naphthenate.

12. The semiconductor element of claim 11, wherein the amount of lead stearate, lead acetate, and lead naphthenate in the insulating material is between 0.002 and 5 percent by weight.

13. The semiconductor element of claim 1, wherein the insulating substance contains ions selected from the group consisting of alkaline, alkaline earth and earth metal.

14. The semiconductor element of claim 13, wherein the amount of alkaline, alkaline earth and earth metal ions in the insulating material is between 0.1 and 20 percent by weight.

15. The semiconductor element of claim 13, wherein the insulating substance contains an alkaline, alkaline earth or earth metal salt of a carboxylic acid.

16. The semiconductor element of claim 15, wherein the insulating substance contains at least one of sodium stearate, magnesium stearate, calcium stearate and aluminum stearate.

17. The semiconductor element of claim 16, wherein the amount of the sodium stearate, magnesium stearate, calcium and aluminum stearate in the insulating substance is between 0.1 and 6 percent by weight.

18. The semiconductor element of claim 1, wherein the insulating substance contains stearic acid.

19. The semiconductor element of claim 18, wherein the insulating substance contains 0.1 to 3 percent by weight of stearic acid.

20. The semiconductor element of claim 2, wherein the fluorine ion content in the insulating coat is from 0.001 to 3 percent by weight.

21. The semiconductor element of claim 2, wherein the insulating substance contains at least one of ammonium fluoride, and a fluoride of an organic amine.

22. The semiconductor element of claim 21, wherein the amount of ammonium fluoride and fluorides of an organic amine is between 0.0002 and 0.2 percent by weight.

23. The semiconductor element of claim 2, wherein the insulating substance contains lead fluoride.

24. The semiconductor element of claim 23, wherein the insulating material contains 0.001 to 30percent lead fluoride.

25. The semiconductor element of claim 2, wherein the insulating substance contains the fluoride of an alkaline, alkaline earth or earth metal.

26. The semiconductor element of claim 25, wherein the total amount of fluoride of an alkaline metal, alkaline earth metal, and an earth metal is between 0.0002 and 15 percent by weight.

27. The semiconductor element of claim 3, wherein the polyhydroxy compound is alizarin, a derivative of alizarin or a chemical compound thereof.

28. The semiconductor element of claim 27 wherein the content of alizarin of the insulating material coating is from 0.1 to 30 percent by weight.

29. The semiconductor element of claim 27, wherein the insulating substance contains lead alizarinate.

30. The semiconductor element of claim 29, wherein the amount of lead alizarinate is in the range between 0.0002 and 2 percent by weight.

31. The semiconductor element of claim 3, wherein the polyhydroxy compound is mannitol, sorbital, quercitin and derivatives thereof.

32. The semiconductor element of claim 31, wherein the insulating layer contains lead quercinate.

33. The semiconductor element of claim 3, wherein the polyhydroxy compound content of the insulating material is between 0.05 and 30 percent by weight.

34. A method for preparation of a coat of insulating substance on the semiconductor body of a semiconductor element with a pn-junction emerging at the surface and coated with an oxide layer which comprises adding to the insulating substance in liquid or plastic phase toluene, xylene, cyclohexanone and/or cyclohexanol, in which a bivalent lead ions donating substances is dissolved, whereby the oxide coat at the surface of the semiconductor body, becomes permeable for bivalent lead ions.

35. The method of claim 34, wherein to the insulating substance are added toluene, xylene, cylohexanone, and/or cyclohexanol, in which alkaline, alkaline earth and/or earth metal ion donating substances are dissolved.

36. The method of claim 35, wherein the semiconductor body, after application of the insulating substance is heated for hardening of the insulating substance.

37. The method for stabilization of the characteristics of the semiconductor element with a semiconductor body, which exhibits at the surface appearing pn-junction which comprises treating the surface of the semiconductor body before application of an insulating coat with a medium which contains bivalent lead ions and an additive, whereby the oxide coat at the surface of the semiconductor body becomes permeable for bivalent lead ions.

38. The method of claim 37, wherein an etching fluid which contains 0.001 to 1,000 mg bivalent lead ions per liter of liquid is used for dissolution of the oxide coat.

39. The method of claim 37, wherein a gas, preferably vapor of aqueous hydrofluoric acid solution or alizarin vapor, is used to dissolve the oxide coat present at the surface of the semiconductor body.

40. The method of claim 37, wherein a rinsing liquid which contains 0.001 to 1,000 mg bivalent lead ions per liter of liquid is used.

41. The method of claim 37, wherein water, and/or alcohol is used as the rinsing liquid.

42. The method of claim 41, wherein water, and/or alcohol with an addition of bivalent lead carboxylic acid salt is used as the rinsing liquid.

43. The method of claim 41, wherein water, and/or alcohol with an addition of lead nitrate is used as the rinsing liquid.

44. The method of claim 43, wherein the rinsing liquid contains 0.002 to 2,000 mg lead salt.

* * * * *